(12) United States Patent
Oh et al.

(10) Patent No.: US 12,674,839 B2
(45) Date of Patent: Jul. 7, 2026

(54) APPARATUS AND METHOD FOR ESTIMATING A STATE OF A BATTERY

(71) Applicants: HYUNDAI MOTOR COMPANY, Seoul (KR); KIA CORPORATION, Seoul (KR); INDUSTRY-ACADEMIC COOPERATION FOUNDATION, YONSEI UNIVERSITY, Seoul (KR)

(72) Inventors: Jaekyung Oh, Yongin-si (KR); Won Jae Choi, Seoul (KR); Ju Seok Kim, Suwon-si (KR); Chulkyu Lee, Anyang-si (KR); Hee Yeon Ryu, Yongin-si (KR); Bohyun Lee, Incheon (KR); Yun Young Choi, Goyang-si (KR); Seongyoon Kim, Incheon (KR); Jung-Il Choi, Goyang-si (KR)

(73) Assignees: HYUNDAI MOTOR COMPANY, Seoul (KR); KIA CORPORATION, Seoul (KR); INDUSTRY-ACADEMIC COOPERATION FOUNDATION, YONSEI UNIVERSITY, Seoul (KR)

( * ) Notice: Subject to any disclaimer, the term of this patent is extended or adjusted under 35 U.S.C. 154(b) by 647 days.

(21) Appl. No.: 17/729,954

(22) Filed: Apr. 26, 2022

(65) Prior Publication Data

US 2023/0003801 A1 Jan. 5, 2023

(30) Foreign Application Priority Data

Jun. 30, 2021 (KR) ........................ 10-2021-0085428

(51) Int. Cl.
*G01R 31/367* (2019.01)
*G06N 20/00* (2019.01)
(Continued)

(52) U.S. Cl.
CPC ........... *G01R 31/367* (2019.01); *G06N 20/00* (2019.01); *H02J 7/40* (2026.01); *H02J 7/80* (2026.01)

(58) Field of Classification Search
CPC .......................... G01R 31/367; G01R 31/392; G01R 31/3648; G06N 20/00; G06N 20/10;
(Continued)

(56) References Cited

U.S. PATENT DOCUMENTS 8,781,982 B1 * 7/2014 Das ........................ G06N 3/084
706/21
10,401,433 B2 * 9/2019 Chow .................... B60K 35/22
(Continued)

FOREIGN PATENT DOCUMENTS

CN 107037373 A 8/2017
JP 2004245627 A 9/2004
(Continued)

OTHER PUBLICATIONS

"Comparison of prognostic algorithms for estimating remaining useful life of batteries", Saha, et.al., Article in Transactions of the Institute of Measurement and Control, Jun. 2009 (Year: 2009).*
(Continued)

*Primary Examiner* — Catherine T. Rastovski
*Assistant Examiner* — Toni D Sauncy
(74) *Attorney, Agent, or Firm* — Lempia Summerfield Katz LLC

(57) ABSTRACT
An apparatus for estimating a state of a battery includes a memory configured to store a program of a neural network including a plurality of pre-trained predictive models and an adaptive hidden layer; and includes at least one processor configured to execute the program. The program includes an instruction for receiving battery data of a target battery, inputting the battery data to the adaptive hidden layer,
(Continued)

selecting one predictive model from the plurality of pre-trained predictive models through the adaptive hidden layer, inputting the battery data to the selected predictive model, and outputting prediction data for a remaining useful life of the target battery through the selected predictive model.

18 Claims, 7 Drawing Sheets

(51) Int. Cl.
*H02J 7/40* (2026.01)
*H02J 7/80* (2026.01)

(58) Field of Classification Search
CPC ...... G06N 3/0442; G06N 3/045; G06N 3/082; G06N 3/08; H02J 7/00032; H02J 7/0047; H02J 7/005
See application file for complete search history.

(56) References Cited

U.S. PATENT DOCUMENTS

| | | | | |
|---|---|---|---|---|
| 10,871,521 | B2 | 12/2020 | Ruan et al. | |
| 2015/0302163 | A1* | 10/2015 | Das | G06N 3/02 705/2 |
| 2016/0195587 | A1* | 7/2016 | Lee | G01R 31/392 702/63 |
| 2017/0023649 | A1* | 1/2017 | You | G01R 31/367 |
| 2017/0205466 | A1* | 7/2017 | He | G06N 3/126 |
| 2017/0294689 | A1 | 10/2017 | Wada et al. | |
| 2018/0136285 | A1 | 5/2018 | You et al. | |
| 2018/0143257 | A1* | 5/2018 | Garcia | G01R 31/382 |
| 2020/0011932 | A1* | 1/2020 | Hooshmand | H01M 10/482 |
| 2020/0164763 | A1 | 5/2020 | Holme | |
| 2020/0175354 | A1* | 6/2020 | Volodarskiy | G06N 3/08 |
| 2020/0371162 | A1 | 11/2020 | Ruan et al. | |
| 2020/0386819 | A1 | 12/2020 | Lee et al. | |
| 2021/0012242 | A1* | 1/2021 | Subbiah | G05B 23/024 |
| 2021/0041503 | A1 | 2/2021 | Ruan et al. | |
| 2021/0066945 | A1* | 3/2021 | Jung | G01R 31/382 |
| 2021/0110274 | A1* | 4/2021 | Tripathi | G06N 5/01 |
| 2021/0288357 | A1 | 9/2021 | Kuriki et al. | |
| 2021/0293890 | A1* | 9/2021 | Gorrachategui | G01R 31/367 |
| 2021/0349157 | A1* | 11/2021 | Srinivasan | G01R 31/389 |

FOREIGN PATENT DOCUMENTS

| | | | |
|---|---|---|---|
| JP | 2019023853 | A | 2/2019 |
| JP | 2020193963 | A | 12/2020 |
| KR | 20180055192 | A | 5/2018 |
| KR | 20200119383 | A | 10/2020 |
| KR | 20200140093 | A | 12/2020 |
| WO | WO-2021089570 | A1 * | 5/2021 .......... G06K 9/6218 |

OTHER PUBLICATIONS

"Lifetime prediction for organic coating under alternating hydro-static pressure by artificial neural network", Wenliang., et al., Nature Scientific Reports, 2017. (Year: 2017).*

This is a translated document for the IDS document: KR 20200119383 A, Kim etal., Oct. 20, 2020 (no translation provided with IDS) "Apparatus and Method for Estimating Status of Battery Based on Artificial Intelligence." It is included here because translation was cited in non-final rejection. (Year: 2020).*

This is a translation of a foreign document used for citations in office action. Kim (KR 20200119383 A) (Year: 2020).*

Gao, et al., "Method for Predicting the Remaining Useful Life of Lithium-Ion Batteries Based on Particle Filter Using Kendall Rank Correlation Coefficient", Energies 2020, 13, 4183 (Year: 2020).*

Klass, et al., "A support vector machine-based state-of-health estimation method for lithium-ion batteries under electric vehicle operation" J. Power Sources 2014, 270, 262-272 (Year: 2014).*

Lin, et al., "A review of SOH estimation methods in Lithium-ion batteries for electric vehicle applications", 7th International Conference on Applied Energy-ICAE2015, Energy Procedia 75 ( 2015 ) 1920-1925 (Year: 2015).*

Lipu, et al. "A review of state of health and remaining useful life estimation methods for lithium-ion battery in electric vehicles: Challenges and recommendations", Journal of Cleaner Production 205 (Year: 2018).*

Qiao, et al., "Prediction of the Remaining Useful Life of Lithium-Ion Batteries Based on Empirical Mode Decomposition and Deep Neural Networks", IEEE Access 2020, 8, 42760-42767 (Year: 2020).*

Qin, et al., "Prognostics of remaining useful life for lithium-ion batteries based on a feature vector selection and relevance vector machine approach", Proceedings of the 2017 IEEE International Conference on Prognostics and Health Management (ICPHM) Jun. 2017. (Year: 2017).*

Xuan, et al., "SOC Prediction of BMS Based on PCA and Improved SVR", IEEE Access, V8, 202 (Year: 2020).*

Zhou, et al., "A novel health indicator for on-line lithium-ion batteries remaining useful life prediction", Journal of Power Sources 321 (2016) (Year: 2016).*

Cheng, et al., "An ensemble prognostic method for lithium-ion battery capacity estimation based on time-varying weight allocation", Applied Energy vol. 266, May 15, 2020, 114817 (Year: 2020).*

Office Action cited in the corresponding Korean patent application No. 10-2021-0085428; May 8, 205; 16 pp.

Office Action cited in the corresponding Korean patent application No. 10-2021-0085428; Nov. 25, 205; 10 pp.

\* cited by examiner

FIG. 3B

APPARATUS AND METHOD FOR ESTIMATING A STATE OF A BATTERY

CROSS-REFERENCE TO RELATED APPLICATION

This application is based on and claims priority under 35 U.S.C. § 119 to Korean Patent Application No. 10-2021-0085428, filed on Jun. 30, 2021 in the Korean Intellectual Property Office, the present disclosure of which is incorporated herein by reference.

BACKGROUND

1. Technical Field

The present disclosure relates to an apparatus and a method for estimating a state of a battery.

2. Description of the Related Art

A state of a battery may be defined as a state of health (SOH) and/or a remaining useful life (RUL).

For example, in a SOH of a battery, a state when a maximum charge capacity is 100% may be an initial state and a state when the maximum charge capacity is reduced to 80% of the initial state may be indicated as 0%. Also, the RUL of a battery may be defined as a remaining life until the SOH reaches 0%.

A technology of predicting an aging state of a battery by training a learning model such as a support vector machine (SVM) or a neural network based on measured value data of the battery, i.e., battery data, is used to estimate a state of battery.

In a conventional technology for state estimation of battery data, a technology of applying only one long short-term memory (LSTM) model pre-trained based on a plurality of pieces of battery data exists.

In such a conventional technology, when data of a portion of cycles (from 1 to XX) of battery data for which state estimation is desired is input to a single LSTM model, only average battery state of a plurality of pieces of battery data used for learning previously and battery data desired to be predicted is predictable. This problem is disadvantageous.

Also, when the above-described disadvantage is solved by increasing LSTM models, overfitting may occur when battery data to be applied to learning is insufficient.

As another conventional technology for state estimation of battery data, a technology that performs learning each time new battery data is input exists.

In such a conventional technology, an increase in cost may be caused through iterative learning of the LSTM model.

As still another conventional technology for state estimation of battery data, a technology that changes internal parameters according to new battery data each time new battery data is input exists.

The above-described disadvantages may also occur in such a conventional technology.

SUMMARY

An aspect of the present disclosure provides an apparatus and a method for estimating a state of a battery to resolve disadvantages of conventional battery state estimation technology.

Additional aspects of the present disclosure, in part, are set forth in the following description and, in part, should be apparent from the description. Alternatively, additional aspects of the present disclosure may be learned by practice of the present disclosure.

According to an aspect of the present disclosure, an apparatus for estimating a state of a battery is provided. The apparatus includes a memory configured to store a program of a neural network including a plurality of pre-trained predictive models and an adaptive hidden layer and includes at least one processor configured to execute the program. The program includes an instruction for receiving battery data of a target battery, inputting the battery data to the adaptive hidden layer, selecting one predictive model from the plurality of pre-trained predictive models through the adaptive hidden layer, inputting the battery data to the selected predictive model, and outputting prediction data for a remaining useful life of the target battery through the selected predictive model.

The adaptive hidden layer includes identifying a similarity between the battery data and data corresponding to each of the plurality of pre-trained predictive models and includes learning so that a single predictive model to which data with a highest similarity to the battery data corresponds applies to the battery data, based on the identified similarity.

The adaptive hidden layer includes applying a weight proportional to a similarity corresponding to each of the plurality of pre-trained predictive models, based on the identified similarity.

The applying of the weight proportional to the similarity corresponding to each of the plurality of pre-trained predictive models includes calculating an average weight of at least one weight applied in advance and the matched weight, with respect to each of the plurality of pre-trained predictive models. The applying of the weight proportional to the similarity corresponding to each of the plurality of pre-trained predictive models also includes applying the calculated average weight to each of the plurality of pre-trained predictive models.

The adaptive hidden layer includes selecting the single predictive model having a highest average weight among the average weights with respect to each of the plurality of pre-trained predictive models and learning so that the single predictive model and the battery data match to each other.

The battery data includes battery data of first cycles of cycles from charging to discharging of the target battery.

Each of the plurality of pre-trained predictive models is trained to predict result data for a remaining useful life of a corresponding battery, based on an input of first battery data of first cycles from charging to discharging of the corresponding battery.

The predicting of the result data for the remaining useful life of the corresponding battery includes predicting, by each of the plurality of pre-trained predictive models, first data for a remaining useful life corresponding to second cycles after skipping a predetermined number of cycles from the first cycles, based on the input of the first battery data of the first cycles from charging to discharging of the corresponding battery to each of the plurality of pre-trained predictive models. The predicting of the result data for the remaining useful life of the corresponding battery also includes minimizing, by each of the plurality of pre-trained predictive models, a difference between the predicted first data and battery data of the second cycles of the corresponding battery.

The predicting of the result data for the remaining useful life of the corresponding battery includes predicting, by each of the plurality of pre-trained predictive models, second data for a remaining useful life corresponding to third cycles after skipping the predetermined number of cycles from the second cycles, based on an input of the first data to each of the plurality of pre-trained predictive models.

Each of the plurality of pre-trained predictive models includes a long short-term memory (LSTM) model.

According to an aspect of the present disclosure, a method for estimating a state of a battery is provided. The method includes receiving battery data of a target battery and inputting the battery data to an adaptive hidden layer included in a neural network. The method also includes selecting a single predictive model from a plurality of pre-trained predictive models included in the neural network through the adaptive hidden layer. The method also includes inputting the battery data to the selected single predictive model and outputting prediction data for a remaining useful life of the target battery through the selected single predictive model.

The selecting of the single predictive model from the plurality of pre-trained predictive models included in the neural network includes identifying, by the adaptive hidden layer, a similarity between the battery data and data corresponding to each of the plurality of pre-trained predictive models. The selecting of the single predictive model from the plurality of pre-trained predictive models included in the neural network also includes learning so that the single predictive model to which data with a highest similarity to the battery data corresponds applies to the battery data, based on the identified similarity.

The selecting of the single predictive model from the plurality of pre-trained predictive models included in the neural network includes applying, by the adaptive hidden layer, a weight proportional to a similarity corresponding to each of the plurality of pre-trained predictive models, based on the identified similarity.

The applying of the weight proportional to the similarity corresponding to each of the plurality of pre-trained predictive models includes calculating an average weight of at least one weight applied in advance and the matched weight, with respect to each of the plurality of pre-trained predictive models. The applying of the weight proportional to the similarity corresponding to each of the plurality of pre-trained predictive models also includes applying the calculated average weight with respect to each of the plurality of pre-trained predictive models.

The selecting of the single predictive model from the plurality of pre-trained predictive models included in the neural network includes learning, by the adaptive hidden layer, so that the single predictive model having a highest average weight among the average weights with respect to each of the plurality of pre-trained predictive models and the battery data match to each other.

The battery data includes battery data of first cycles of cycles from charging to discharging of the target battery.

Each of the plurality of pre-trained predictive models is trained to predict result data for a remaining useful life of a corresponding battery, based on an input of first battery data of first cycles from charging to discharging of the corresponding battery.

The predicting of the result data for the remaining useful life of the corresponding battery includes predicting, by each of the plurality of pre-trained predictive models, first data for a remaining useful life corresponding to second cycles after skipping a predetermined number of cycles from the first cycles, based on the input of the first battery data of the first cycles from charging to discharging of the corresponding battery to each of the plurality of pre-trained predictive models. The predicting of the result data for the remaining useful life of the corresponding battery also includes minimizing, by each of the plurality of pre-trained predictive models, a difference between the predicted first data and battery data of the second cycles of the corresponding battery.

The predicting of the result data for the remaining useful life of the corresponding battery includes predicting, by each of the plurality of pre-trained predictive models, second data for a remaining useful life corresponding to third cycles after skipping the predetermined number of cycles from the second cycles, based on an input of the first data to each of the plurality of pre-trained predictive models.

Each of the plurality of pre-trained predictive models includes an LSTM model.

BRIEF DESCRIPTION OF THE DRAWINGS

These and/or other aspects of the present disclosure should become apparent and more readily appreciated from the following description of the embodiments, taken in conjunction with the accompanying drawings of which:

FIGS. 3A and 3B are diagrams illustrating an operation principle of a long short-term memory (LSTM) model according to an embodiment;

DETAILED DESCRIPTION

Figure 1:
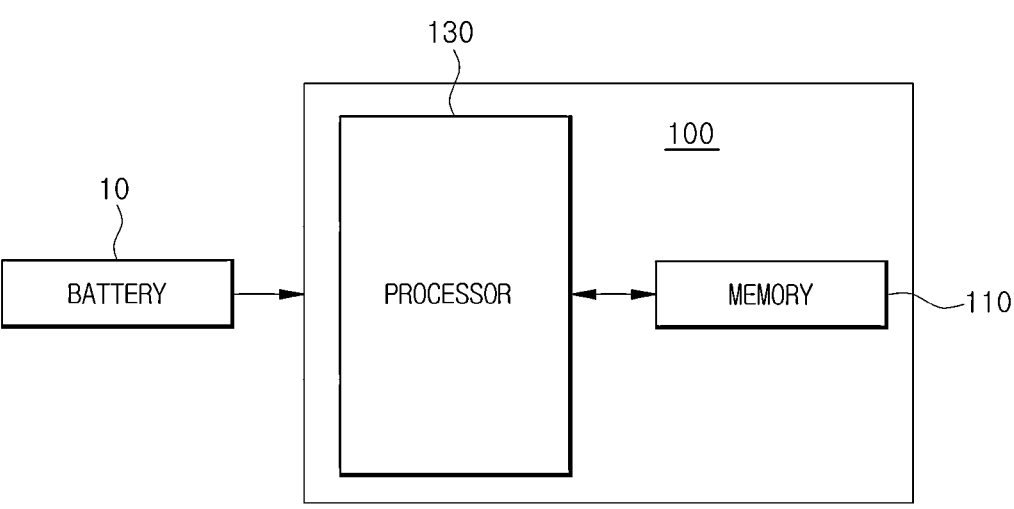
FIG. 1 is a block diagram illustrating an apparatus for estimating a state of a battery according to an embodiment.

Like reference numerals throughout the specification denote like elements. Also, this specification does not describe all the elements according to embodiments of the present disclosure, and descriptions well-known in the art to which the present disclosure pertains or overlapped portions have been omitted. The terms such as "~part", "~device", "~module", and the like may refer to a unit for processing at least one function or act. For example, the terms may refer to at least one process processed by at least one hardware or software. According to embodiments, a plurality of "~parts", "~devices", or "~modules" may be embodied as a single element, or a single of "~part", "~device", or "~module" may include a plurality of elements. When a part, device, module, or the like of the present disclosure is described as having a purpose or performing an operation, function, or the like, the part, device, or element should be considered herein as being "configured to" meet that purpose or to perform that operation or function.

It should be understood that when an element is referred to as being "connected" to another element, it can be directly or indirectly connected to the other element, wherein the indirect connection includes "connection" via a wireless communication network.

It should be understood that the term "include" when used in this specification, specify the presence of stated features, integers, steps, operations, elements, and/or components. However, the term "include" does not preclude the presence or addition of one or more other features, integers, steps, operations, elements, components, and/or groups thereof.

It should be understood that, although the terms first, second, etc. may be used herein to describe various elements, these elements should not be limited by these terms.

It should be understood that the singular forms are intended to include the plural forms as well, unless the context clearly dictates otherwise.

Reference numerals used for method steps are just used for convenience of explanation, but the reference numerals are not used to limit an order of the steps. Thus, if the context clearly dictates otherwise, the written order may be practiced otherwise.

Hereinafter, an operation principle and embodiments are described in detail with reference to the accompanying drawings.

FIG. 1 is a block diagram illustrating an apparatus 100 for estimating a state of a battery 10 according to an embodiment.

Referring to FIG. 1, the apparatus 100 for estimating the state of the battery 10 may include a memory 110 and a processor 130.

The memory 110 may store a program of a deep learning-based neural network.

The neural network may include a plurality of predictive models and an adaptive hidden layer.

Each of the plurality of predictive models may be pre-trained to predict result data for a remaining useful life (RUL) of the battery 10.

For example, each of the plurality of predictive models may include a long short-term memory (LSTM) model.

The adaptive hidden layer may select a single predictive model from the plurality of pre-trained predictive models to predict the RUL of the battery 10.

The neural network may include a LSTM model concatenate layer and an adaptive hidden layer.

In the LSTM model concatenate layer, an operation of pre-training of each of the plurality of predictive models may be performed.

Also, in the adaptive hidden layer, an operation of selecting a single predictive model from the plurality of pre-trained predictive models may be performed.

The program of the neural network may include an instruction for receiving battery data of the battery 10. The program of the neural network may include an instruction for inputting the battery data to the adaptive hidden layer to select the single predictive model from the plurality of pre-trained predictive models through the adaptive hidden layer.

Also, the program of the neural network may include an instruction for inputting the battery data to the selected predictive model to output prediction data for the RUL of the battery 10 through the selected predictive model.

Meanwhile, one or more predictive model may be added to the neural network, and the number of predictive models of the neural network may not be limited.

For instance, the number of predictive models of the neural network may correspond to the number of pieces of received battery data.

Figure 2:
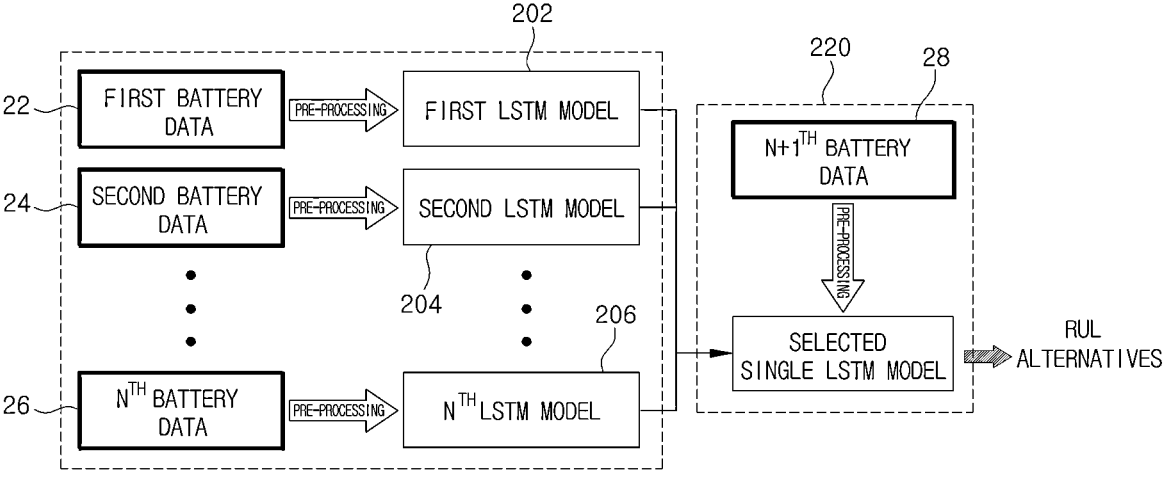
FIG. 2 is a diagram illustrating an operation of an apparatus for estimating a state of a battery according to an embodiment.

FIG. 2 is a diagram illustrating an operation of the apparatus 100 for estimating the state of the battery 10 according to an embodiment.

Referring to FIG. 2, a plurality of predictive models may include a first LSTM model 202, a second LSTM model 204, and/or an $n^{th}$ LSTM model 206, or the like. Here, n represents an integer.

The first LSTM model 202 may be a model pre-trained based on first battery data 22 of a first battery (also referred to as a first battery cell). For example, the first LSTM model 202 may be pre-trained based on pre-processed first battery data 22.

The first battery data 22 may include data related to charging and discharging from fresh data of the first battery to a RUL of the first battery.

The first LSTM model 202 may predict result data for a RUL of a target battery of input battery data.

The second LSTM model 204 may be a model pre-trained based on second battery data 24 of a second battery (also referred to as a second battery cell). For example, the second LSTM model 204 may be pre-trained based on pre-processed second battery data 24.

The second battery data 24 may include data related to charging and discharging from fresh data of the second battery to a RUL of the second battery.

The second LSTM model 204 may predict the result data for the RUL of the target battery of input battery data.

The $n^{th}$ LSTM model 206 may be a model pre-trained based on $n^{th}$ battery data 26 of an $n^{th}$ battery (also referred to as an $n^{th}$ battery cell). For example, the $n^{th}$ LSTM model 206 may be pre-trained based on pre-processed $n^{th}$ battery data 26.

The $n^{th}$ battery data 26 may include data related to charging and discharging from fresh data of the $n^{th}$ battery to a RUL of the $n^{th}$ battery.

The $n^{th}$ LSTM model 206 may predict the result data for the RUL of the target battery of input battery data.

In a conventional general LSTM model, for example, assuming that data from a first cycle to a $50^{th}$ cycle are input data of the LSTM model, the LSTM model determines output data of the LSTM model by predicting data from a second cycle to the $50^{th}$ cycle and then compares the predicted data from the second cycle to the $50^{th}$ cycle with actual data from the second cycle to the $50^{th}$ cycle. Thus, output data corresponding to the input data may be predicted.

By contrast, each of the LSTM models according to an embodiment of the present disclosure may be operated differently from the above-described conventional general LSTM model.

Figure 3A:
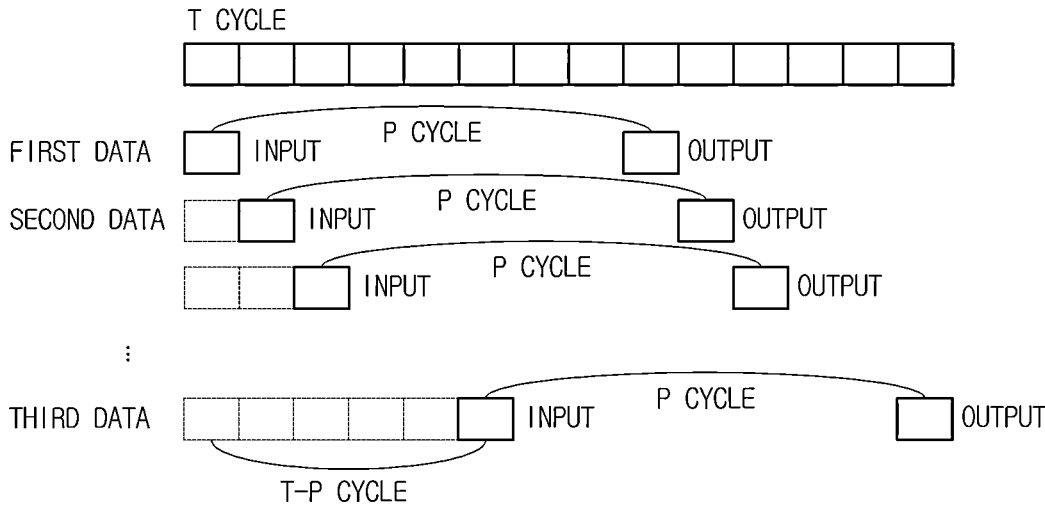
Figure 3B:
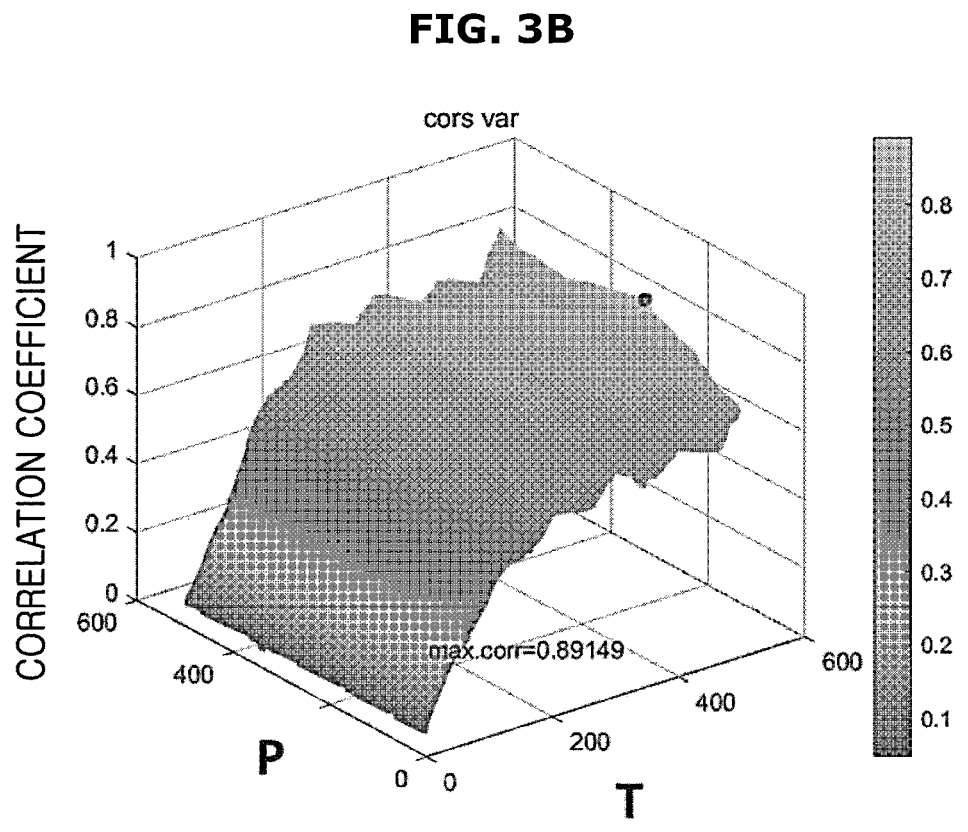

FIGS. 3A and 3B are diagrams illustrating an operation principle of an LSTM model according to an embodiment.

In order to describe an operating principle of each LSTM model according to an embodiment with reference to FIGS. 3A and 3B, it is assumed that the number of cycles from charging to discharging of a battery are T in total, and the T cycles sequentially include first cycles, second cycles . . . and/or $n^{th}$ cycles.

Referring to FIG. 3A, first data (also referred to as first battery data) corresponding to the first cycles, second data (also referred to as second battery data) corresponding to the second cycles, and T-$P^{th}$ data (also referred to as T-$P^{th}$ battery data) corresponding to T-$P^{th}$ cycles may be sequentially input to the LSTM model according to an embodiment.

Also, referring to FIG. 3A, when the first data corresponding to the first cycles is input to the LSTM model, the LSTM model may be configured to predict data of cycles after skipping a predetermined number of or randomly designated number of cycles (e.g. referred to as p cycle) from the first cycles, rather than output second data corresponding to the second cycles, which are immediately following the first cycles.

Also, referring to FIG. 3A, when the second data corresponding to the second cycles is input to the LSTM model, the LSTM model may be configured to predict data of cycles after skipping the predetermined number of or randomly designated number of cycles (e.g. referred to as p cycle) from the second cycles.

In addition, referring to FIG. 3A, when the $T-P^{th}$ data corresponding to the $T-P^{th}$ cycles is input to the LSTM model, the LSTM model may be configured to predict data of cycles after skipping the predetermined number of or randomly designated number of cycles (e.g. referred to as p cycle) from the $T-P^{th}$ cycles.

The above-described p cycle may be determined based on a correlation coefficient, which is given by $$\text{Correlation}\left(\frac{Q_{i+T} - Q_i}{T}, Q_{i+T+P}\right).$$

T designates a total length of entire input data, i.e., the total number of cycles of received battery data, i designates a starting point, P designates a difference between a cycle of input data and a cycle of output data, and Q designates a capacity of data.

Meanwhile, the correlation coefficient may be determined by applying methods such as volume charge density (dQ/dV), principal component analysis (PCA), etc., instead of using Q.

An analysis graph of the correlation coefficient above may be as shown in FIG. 3B.

Referring to FIG. 3B, it may be efficient to define a learning method of the LSTM model, by determining T value and P value so that the correlation coefficient is greater than or equal to a predetermined value. In data adjacent to each other, features are not clear due to measurement errors, and the like.

Accordingly, a conventional general learning method of LSTM model that applies data adjacent to each other as input data show low accuracy.

Thus, according to an embodiment of the present disclosure, data spaced apart from each other by a predetermined number of cycles may be sequentially input to the LSTM model, instead of applying the conventional general learning method of LSTM model that inputs data adjacent to each other sequentially.

For instance, with assumptions that T is 50, P is 100, data of the first to $50^{th}$ cycles is input data of the LSTM model, and data of the $101^{th}$ to $150^{th}$ cycles is output data of the LSTM model, a learning method of LSTM model is performed in advance according to an embodiment of the present disclosure as follows.

The LSTM model may receive actual data of the first to $50^{th}$ cycles as input data and generate prediction data of the $101^{th}$ to $150^{th}$ cycles based on the received input data.

Afterwards, the LSTM model may calculate a difference between the prediction data of the $101^{th}$ to $150^{th}$ cycles and actual data of the $101^{th}$ to $150^{th}$ cycles.

Afterwards, the LSTM model may be trained so that the difference between the prediction data of the $101^{th}$ to $150^{th}$ cycles and the actual data of the $101^{th}$ to $150^{th}$ cycles is minimized.

With respect to cycles after the first to $50^{th}$ cycles, the LSTM model may receive corresponding input data, generate prediction data, calculate a difference between the prediction data and the input data, and be trained so that the difference between the prediction data and the input data is minimized. For instance, a parameter value, etc., may be applied to the LSTM model to minimize the difference between the prediction data and the input data.

For example, the LSTM model may apply prediction data of the first to $50^{th}$ cycles as input data of cycles after the first to $50^{th}$ cycles.

The LSTM model may generate prediction data of the $201^{th}$ to $250^{th}$ cycles by using the generated prediction data of the $101^{th}$ to $150^{th}$ cycles as input data. The LSTM model may calculate a difference between the prediction data of the $201^{th}$ to $250^{th}$ cycles and actual data of the $201^{th}$ to $250^{th}$ cycles. The LSTM model may be trained so that the difference between the prediction data of the $201^{th}$ to $250^{th}$ cycles and the actual data of the $201^{th}$ to $250^{th}$ cycles is minimized.

Referring again to FIG. 2, when new battery data, e.g., data of specific cycles of $n+1^{th}$ battery data 28 is input, the adaptive hidden layer 220 may select a single model through learning, unlike a conventional hidden layer that integrates LSTM models.

The adaptive hidden layer 220 may receive battery data such as the $n+1^{th}$ battery data 28 and may select a single model to apply a prediction to a RUL of a battery from a plurality of LSTM models, based on the $n+1^{th}$ battery data 28.

For example, the adaptive hidden layer 220 may pre-process the $n+1^{th}$ battery data 28.

For instance, the pre-processing may refer to inputting the $n+1^{th}$ battery data 28 of specific cycles to the adaptive hidden layer 220 and processing the $n+1^{th}$ battery data 28 to be suitable for the selected single LSTM model.

For example, the pre-processing may include identification of a state of health (SOH) of a battery, calculation of a volume charge density (dQ/dV) and/or PCA, and the like.

The adaptive hidden layer 220 may select a single LSTM model to apply a prediction to a RUL of the battery 10 from the plurality of LSTM models based on the pre-processed $n+1^{th}$ battery data 28.

The adaptive hidden layer 220 may identify a similarity between the pre-processed $n+1^{th}$ battery data 28 and data corresponding to each of pre-trained plurality of predictive models.

For instance, the data corresponding to each of the pre-trained plurality of predictive models may include corresponding battery data used for learning.

The adaptive hidden layer 220 may select a single LSTM model to which data with a highest similarity to the pre-processed $n+1^{th}$ battery data 28 is matched, based on the similarity between the pre-processed $n+1^{th}$ battery data 28 and the data corresponding to each of pre-trained plurality of predictive models. Also, the adaptive hidden layer 220 may learn so that the selected single LSTM model matches to the $n+1^{th}$ battery data 28.

For instance, the adaptive hidden layer 220 may match a weight proportional to a similarity corresponding to each of the pre-trained plurality of predictive models, based on the similarity between the pre-processed $n+1^{th}$ battery data 28 and the data corresponding to each of pre-trained plurality of predictive models.

For example, when it is assumed that a similarity between the pre-processed $n+1^{th}$ battery data 28 and data of the first LSTM model 202 is 60%, a similarity between the pre-processed $n+1^{th}$ battery data 28 and data of the second LSTM model 204 is 30%, and a similarity between the pre-processed $n+1^{th}$ battery data 28 and data of the $n^{th}$ LSTM model 206 is 10%, the adaptive hidden layer 220 may match a weight of 60 scores to the first LSTM model 202, a weight of 30 scores to the second LSTM model 204, and a weight of 10 scores to the n$^{th}$ LSTM model 206, with respect to the n+1$^{th}$ battery data 28.

For instance, the adaptive hidden layer 220 may select the first LSTM model 202 having a highest weight.

For example, assuming that the weight of 50 scores, i.e., at least one weight applied in advance, is matched in advance, a weight of 55 scores, which is an average weight of 60 scores and 50 scores, may correspond to the first LSTM model 202.

Also, assuming that the weight of 30 scores is matched in advance, a weight of 30 scores, which is an average weight of 30 scores and 30 scores, may correspond to the second LSTM model 204.

Also, assuming that the weight of 20 scores is matched in advance, a weight of 15 scores, which is an average weight of 10 scores and 20 scores, may correspond to the n$^{th}$ LSTM model 206.

For instance, the adaptive hidden layer 220 may select the first LSTM model 202 having a highest average weight.

The selected single LSTM model may perform prediction on a RUL of the battery 10 based on the battery data of the battery 10, i.e., generate and output prediction data on the RUL of the battery 10.

Figure 4:
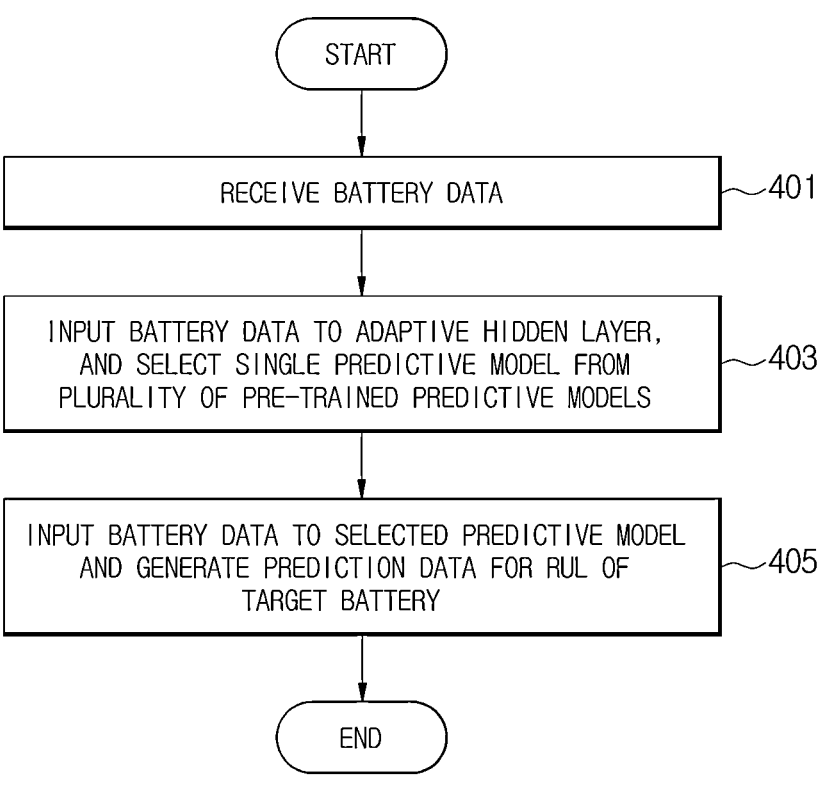
FIG. 4 is a flowchart illustrating operations of an apparatus for estimating a state of a battery according to an embodiment.
Figure 5:
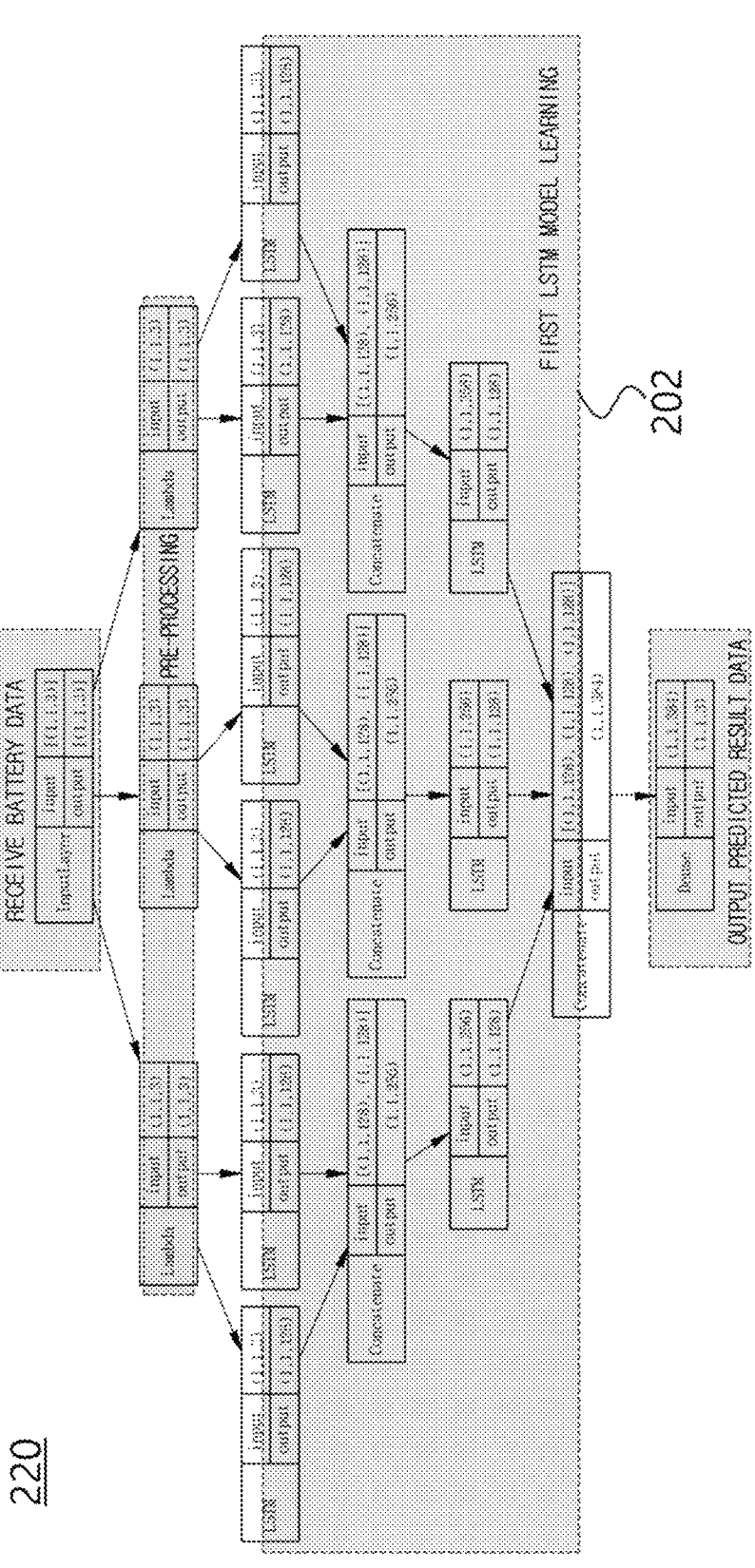
FIG. 5 is a diagram illustrating an operation of an adaptive hidden layer according to an embodiment.

FIG. 4 is a flowchart illustrating operations of the apparatus for estimating a state of a battery 100 (and/or the processor 130) according to an embodiment. FIG. 5 is a diagram illustrating an operation of the adaptive hidden layer 220 according to an embodiment.

Referring to FIG. 4, the apparatus for estimating a state of a battery 100 may receive battery data (401).

The battery data may include battery data of first cycles among cycles from charging to discharging of a target battery.

The apparatus for estimating a state of a battery 100 may input the battery data to the adaptive hidden layer 220 included in a neural network and may select a single predictive model from a plurality of pre-trained predictive models included in the neural network through the adaptive hidden layer 220 (403).

The adaptive hidden layer 220 may identify a similarity between the battery data and data corresponding to each of the plurality of pre-trained predictive models. Also, the adaptive hidden layer 220 may learn so that the single predictive model to which data with a highest similarity to the battery data corresponds applies to the battery data, based on the identified similarity.

The adaptive hidden layer 220 may match a weight proportional to a similarity corresponding to each of the plurality of pre-trained predictive models, based on the identified similarity.

The adaptive hidden layer 220 may calculate an average weight of at least one weight applied in advance and the matched weight, with respect to each of the plurality of pre-trained predictive models and may match the average weight with respect to each of the plurality of pre-trained predictive models.

The adaptive hidden layer 220 may select a single predictive model having a highest average weight among the average weights with respect to each of the plurality of pre-trained predictive models and learn so that the selected single predictive model and the battery data match to each other.

For example, referring to FIG. 5, the adaptive hidden layer 220 may include an input layer to receive the battery data.

Also, the adaptive hidden layer 220 may perform pre-processing on the input battery data using a lamda function, and the like.

Each of the plurality of pre-trained predictive models may be trained to predict result data for a RUL of a corresponding battery, based on an input of first battery data of first cycles among cycles from charging to discharging of the corresponding battery.

The prediction of the result data for the RUL of the corresponding battery may include predicting first data for a RUL corresponding to second cycles after skipping a predetermined number of cycles from the first cycles by each of the plurality of pre-trained predictive models, based on the input of the first battery data of the first cycles of the corresponding battery to each of the plurality of pre-trained predictive models.

Also, the prediction of the result data for the RUL of the corresponding battery may include minimizing a difference between the predicted first data and battery data of the second cycle of the corresponding battery by each of the plurality of pre-trained predictive models.

Also, the prediction of the result data for the RUL of the corresponding battery may include predicting second data for a RUL corresponding to third cycles after skipping the predetermined number of cycles from the second cycles by each of the plurality of pre-trained predictive models, based on an input of the first data to each of the plurality of pre-trained predictive models.

In addition, the prediction of the result data for the RUL of the corresponding battery may include minimizing a difference between the predicted second data and actual battery data of the third cycles of the corresponding battery by each of the plurality of pre-trained predictive models.

The apparatus for estimating a state of a battery 100 may input battery data to the selected predictive model and output prediction data for a RUL of the target battery through the selected predictive model (405).

Referring to FIG. 5, for example, the predictive model selected by the adaptive hidden layer 220, e.g., the first LSTM model 202, may repeatedly learn to output prediction data based on the input battery data. Also, the first LSTM model 202 may include a concatenate layer and may generate and output final prediction data through concatenation of a plurality of pieces of prediction data through iterative learning through the concatenate layer.

Figure 6:
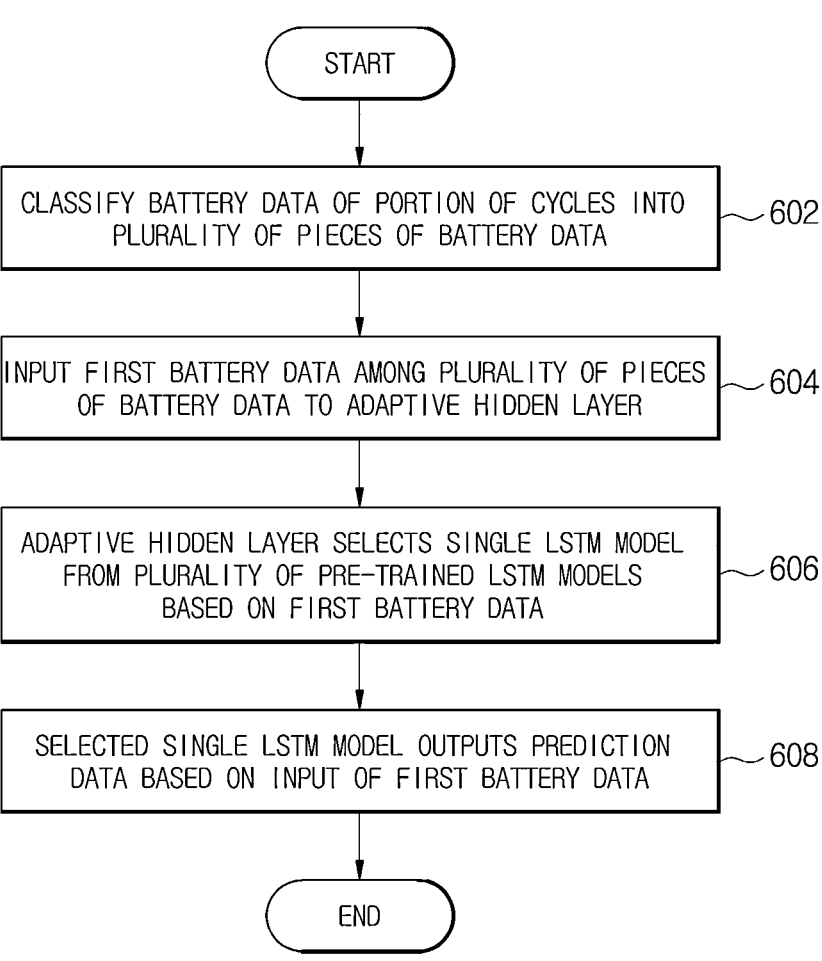
FIG. 6 is a flowchart illustrating operations of an apparatus for estimating a state of a battery according to an embodiment.

FIG. 6 is a flowchart illustrating operations of the apparatus for estimating a state of a battery 100 (or the processor 130) according to an embodiment.

The apparatus 100 for estimating a state of the battery 10 may classify battery data of a portion of cycles of the battery 10 whose RUL is desired to be predicted into a plurality of pieces of battery data (602).

The apparatus 100 for estimating a state of the battery 10 may classify the battery data of the portion of cycles into first battery data of first cycles (1 to XX), second battery data of second cycles (XX to YY), and third battery data of third cycles (YY to ZZ).

The apparatus 100 for estimating a state of the battery 10 may input the first battery data among the plurality of pieces of battery data to the adaptive hidden layer 220 (604).

The adaptive hidden layer 220 may select a single LSTM model from a plurality of pre-trained LSTM models based on the first battery data (606).

For instance, learning results of the first LSTM model, the second LSTM model and the third LSTM model, which have been previously trained using data of a target battery, may be stored in the adaptive hidden layer 220.

The adaptive hidden layer 220 may select a single LSTM model to be used for outputting prediction data for a RUL of the first battery data from the plurality of LSTM models, based on the first battery data and the stored learning results.

The selected single LSTM model may output the prediction data based on the input of the first battery data (608).

For instance, the selected single LSTM model may generate prediction result data of the RUL (and/or prediction result data of a state of health) of the first battery data.

For example, the prediction result data for the RUL of the first battery data may be prediction result data for the RUL of the third cycles.

The selected single LSTM model may be pre-trained to match to each other (to be identical to or to be similar to each other) by comparing the generated prediction result data with the third battery data of the actual third cycles (YY~ZZ). The result of such a training may be applied only to the adaptive hidden layer 220 and may not be applied to a concatenate layer of the LSTM models that have been trained previously.

Also, when prediction data is output, the selected single LSTM model may repeatedly perform the above-described operations. Thus, an accuracy of prediction data generation of the selected single LSTM model may be improved.

According to the embodiment of the present disclosure, provided is a new neural network structure including an adaptive hidden layer that bundles a plurality of pre-trained LSTM models based on battery data related to charging and discharging of several batteries into one for measuring new battery data.

Further, when each of the plurality of LSTM models is trained, with respect to first battery data, a result of a RUL of battery data of cycles that skips a predetermined number of cycles from the first battery data may be predicted (and/or trained) in order to avoid noise between adjacent data.

As is apparent from the above, according to the embodiment of the present disclosure, the apparatus and method for estimating a state of a battery can generate a large neural network structure by adding a predictive model such as a LSTM model to a neural network.

According to the embodiment of the present disclosure, the apparatus and method for estimating a state of a battery can be applied to predict new battery data by bundling LSTM models, which are efficient when prediction is made with specific battery data, into a single LSTM model. Thus, a prediction accuracy of the bundled LSTM model can be increased.

According to the embodiment of the present disclosure, the apparatus and method for estimating a state of a battery can be applied to various batteries under various operating conditions because the apparatus and the method for estimating a state of a battery are data-based prediction through a neural network, rather than approximate a polynomial of a specific class or under a specific operating conditions.

According to the embodiment of the present disclosure, the apparatus and the method for estimating a state of a battery can remove data noise between adjacent cycles through a method of learning a predictive model at a specific cycle interval, rather than using a result of adjacent cycles. Also, a cycle interval having a high correlation coefficient is found out and each data skipped as much as the cycle interval having a high correlation coefficient can be input to a predictive model, and thus an accuracy of the predictive model can be improved.

According to the embodiment of the present disclosure, the apparatus and the method for estimating a state of a battery can, when new battery data for learning is received, simply add an individual predictive model such as the LSTM model only, instead of relearning an entire network structure. Thus, an additional learning time may be reduced, compared to a conventional neural network.

According to the embodiment of the present disclosure, the apparatus and the method for estimating a state of a battery can, even when a used battery, rather than a new battery (also referred to as a fresh cell), is received, predict a remaining useful life of the used battery by applying individual standardization information.

According to the embodiment of the present disclosure, the apparatus and method for estimating a state of a battery can predict both a future tendency of a state of health of a battery as well as a RUL which is a result at a specific point in time.

Embodiments can thus be implemented through computer readable code/instructions in/on a medium, e.g., a computer readable medium, to control at least one processing element to implement any above described embodiment. The medium can correspond to any medium/media permitting the storing and/or transmission of the computer readable code.

The computer-readable code can be recorded on a medium or transmitted through the Internet. The medium may include read only memory (ROM), random access memory (RAM), magnetic tapes, magnetic disks, flash memories, and optical recording medium.

Although embodiments have been described for illustrative purposes, those having ordinary skill in the art should appreciate that various modifications, additions and substitutions are possible, without departing from the scope and spirit of the present disclosure. Therefore, embodiments have not been described for limiting purposes.

What is claimed is:

1. An apparatus for estimating a state of a battery, the apparatus comprising:

a memory configured to store a program of a neural network including a plurality of pre-trained predictive models and an adaptive hidden layer; and at least one processor configured to execute the program, wherein the program includes an instruction for:

receiving battery data of a target battery, inputting the battery data to the adaptive hidden layer, wherein the adaptive hidden layer is configured to select one predictive model from the plurality of pre-trained predictive models, inputting the battery data to the selected predictive model and outputting prediction data for a remaining useful life of the target battery through the selected predictive model, wherein each of the plurality of pre-trained predictive models is trained, in response to input data corresponding to a first cycle, to predict result data for a second cycle that is spaced apart from the first cycle by skipping a predetermined number of non-adjacent cycles (P), instead of predicting data for a cycle immediately following the first cycle, and wherein the predetermined number of cycles (P) to be skipped is determined based on a correlation coefficient, the correlation coefficient being calculated based on the formula Correlation$(Q_{i+T}-Q_i/T,Q_{i+T+P})$, where Q is a capacity of data, i is a starting point, T is a total length of entire input data, and P is a difference between a cycle of the input data and a cycle of output data.

2. The apparatus of claim 1, wherein the adaptive hidden layer comprises:

identifying a similarity between the battery data and data corresponding to each of the plurality of pre-trained predictive models; and learning so that a single predictive model to which data with a highest similarity to the battery data corresponds applies to the battery data, based on the identified similarity.

3. The apparatus of claim 2, wherein the adaptive hidden layer comprises applying a weight proportional to a similarity corresponding to each of the plurality of pre-trained predictive models, based on the identified similarity.

4. The apparatus of claim 3, wherein the applying of the weight proportional to the similarity corresponding to each of the plurality of pre-trained predictive models comprises:

calculating an average weight of at least one weight applied in advance and a matched weight, with respect to each of the plurality of pre-trained predictive models; and applying the calculated average weight to each of the plurality of pre-trained predictive models.

5. The apparatus of claim 4, wherein the adaptive hidden layer comprises selecting the single predictive model having a highest average weight among the average weights with respect to each of the plurality of pre-trained predictive models and learning so that the single predictive model and the battery data match to each other.

6. The apparatus of claim 1, wherein the battery data includes battery data of a first cycle from charging to discharging of the target battery.

7. The apparatus of claim 6, wherein each of the plurality of pre-trained predictive models is trained to predict result data for a remaining useful life of a corresponding battery, based on an input of first battery data of a first cycle from charging to discharging of the corresponding battery, and wherein predicting the result data for the remaining useful life of the corresponding battery comprises:

predicting, by each of the plurality of pre-trained predictive models, first data for a remaining useful life corresponding to a second cycle after skipping the predetermined number of cycles from the first cycle, based on the input of the first battery data of the first cycle from charging to discharging of the corresponding battery to each of the plurality of pre-trained predictive models; and minimizing, by each of the plurality of pre-trained predictive models, a difference between the predicted first data and battery data of the second cycle of the corresponding battery.

8. The apparatus of claim 1, wherein the program further includes an instruction for predicting result data for a remaining useful life of a corresponding battery, and wherein the predicting of the result data for the remaining useful life of the corresponding battery comprises predicting, by each of the plurality of pre-trained predictive models, second data for a remaining useful life corresponding to a third cycle after skipping the predetermined number of cycles from a second cycle, based on an input of first data to each of the plurality of pre-trained predictive models.

9. The apparatus of claim 1, wherein each of the plurality of pre-trained predictive models includes a long short-term memory (LSTM) model.

10. A method for estimating a state of a battery, the method comprising:

receiving battery data of a target battery;

inputting the battery data to an adaptive hidden layer included in a neural network, wherein the adaptive hidden layer is configured to select a single predictive model from a plurality of pre-trained predictive models included in the neural network;

inputting the battery data to the selected single predictive model; and outputting prediction data for a remaining useful life of the target battery through the selected single predictive model, wherein each of the plurality of pre-trained predictive models is configured, in response to input data corresponding to a first cycle, to predict result data for a second cycle that is spaced apart from the first cycle by skipping a predetermined number of non-adjacent cycles (P), instead of predicting data for a cycle immediately following the first cycle, and wherein the predetermined number of cycles (P) to be skipped is determined based on a correlation coefficient, the correlation coefficient being calculated based on the formula Correlation($Q_{i+T}$–$Q_i$/T,$Q_{i+T+P}$), where Q is a capacity of data, i is a starting point, T is a total length of entire input data, and P is a difference between a cycle of the input data and a cycle of output data.

11. The method of claim 10, wherein the selecting of the single predictive model from the plurality of pre-trained predictive models included in the neural network comprises:

identifying, by the adaptive hidden layer, a similarity between the battery data and data corresponding to each of the plurality of pre-trained predictive models; and learning so that the single predictive model to which data with a highest similarity to the battery data corresponds applies to the battery data, based on the identified similarity.

12. The method of claim 11, wherein the selecting of the single predictive model from the plurality of pre-trained predictive models included in the neural network comprises:

applying, by the adaptive hidden layer, a weight proportional to a similarity corresponding to each of the plurality of pre-trained predictive models, based on the identified similarity.

13. The method of claim 12, wherein the applying of the weight proportional to the similarity corresponding to each of the plurality of pre-trained predictive models comprises:

calculating an average weight of at least one weight applied in advance and a matched weight, with respect to each of the plurality of pre-trained predictive models; and applying the calculated average weight with respect to each of the plurality of pre-trained predictive models.

14. The method of claim 13, wherein the selecting of the single predictive model from the plurality of pre-trained predictive models included in the neural network comprises:

learning, by the adaptive hidden layer, so that the single predictive model having a highest average weight among the average weights with respect to each of the plurality of pre-trained predictive models and the battery data match to each other.

15. The method of claim 10, wherein the battery data includes battery data of a first cycle from charging to discharging of the target battery.

16. The method of claim 15, wherein each of the plurality of pre-trained predictive models is trained to predict result data for a remaining useful life of a corresponding battery, based on an input of first battery data of a first cycle from charging to discharging of the corresponding battery, and wherein predicting the result data for the remaining useful life of the corresponding battery comprises:

predicting, by each of the plurality of pre-trained predictive models, first data for a remaining useful life corresponding to a second cycle after skipping the predetermined number of cycles from the first cycle, based on the input of the first battery data of the first cycle from charging to discharging of the corresponding battery to each of the plurality of pre-trained predictive models; and minimizing, by each of the plurality of pre-trained predictive models, a difference between the predicted first data and battery data of the second cycle of the corresponding battery.

17. The method of claim 10, further comprising predicting result data for a remaining useful life of a corresponding battery, wherein the predicting of the result data for the remaining useful life of the corresponding battery comprises predicting, by each of the plurality of pre-trained predictive models, second data for a remaining useful life corresponding to a third cycle after skipping the predetermined number of cycles from a second cycle, based on an input of first data to each of the plurality of pre-trained predictive models.

18. The method of claim 10, wherein each of the plurality of pre-trained predictive models includes a long short-term memory (LSTM) model.

* * * * *